(12) United States Patent
Chen

(10) Patent No.: US 12,372,571 B2
(45) Date of Patent: Jul. 29, 2025

(54) METHOD AND DEVICE FOR DETECTING LAYOUT OF INTEGRATED CIRCUIT, AND STORAGE MEDIUM

(71) Applicant: CHANGXIN MEMORY TECHNOLOGIES, INC., Hefei (CN)

(72) Inventor: Miaomiao Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 666 days.

(21) Appl. No.: 17/806,072

(22) Filed: Jun. 8, 2022

(65) Prior Publication Data
US 2023/0133766 A1 May 4, 2023

Related U.S. Application Data

(63) Continuation of application No. PCT/CN2021/138423, filed on Dec. 15, 2021.

(30) Foreign Application Priority Data

Nov. 3, 2021 (CN) .......................... 202111293505.8

(51) Int. Cl.
*G01R 31/26* (2020.01)
*G06F 30/392* (2020.01)

(52) U.S. Cl.
CPC ....... *G01R 31/2621* (2013.01); *G06F 30/392* (2020.01)

(58) Field of Classification Search
CPC ......................... G01R 31/2621; G06F 30/392
USPC ........................................................ 716/111
See application file for complete search history.

(56) References Cited

U.S. PATENT DOCUMENTS

| 9,006,831 B2 * | 4/2015 | Koyama | H10D 64/257 |
| | | | 257/357 |
| 9,685,433 B2 | 6/2017 | Li | |
| 2006/0091558 A1 * | 5/2006 | Huang | H01L 23/49838 |
| | | | 257/E23.079 |
| 2007/0057344 A1 | 3/2007 | Lee | |
| 2007/0228520 A1 * | 10/2007 | Winn | H01L 23/5223 |
| | | | 257/580 |

(Continued)

FOREIGN PATENT DOCUMENTS

| CN | 102663170 A | 9/2012 |
| CN | 103973291 A | 8/2014 |
| CN | 105428271 A | 3/2016 |

*Primary Examiner* — Jack Chiang
*Assistant Examiner* — Suchin Parihar
(74) *Attorney, Agent, or Firm* — Syncoda LLC; Feng Ma

(57) ABSTRACT

A method for detecting a layout of an integrated circuit includes: a finger structure is determined in the layout, the finger structure including at least one upper connection source-drain terminal and at least one upper connected via, the at least one upper connected source-drain terminal being electrically connected to an upper metal line through the at least one upper connected via; a number of the at least one upper connected source-drain terminal and a number of the at least one upper connected via are calculated; and for the finger structure, in response to the number of the at least one upper connected source-drain terminal being greater than the number of the at least one upper connected via, it is determined that the finger structure is an unqualified finger structure.

20 Claims, 15 Drawing Sheets

(56) References Cited

U.S. PATENT DOCUMENTS

| | | | |
|---|---|---|---|
| 2008/0218749 A1* | 9/2008 | Kuan | H01L 22/34 |
| | | | 174/355 |
| 2014/0312457 A1* | 10/2014 | Li | H10D 1/20 |
| | | | 438/400 |
| 2015/0303982 A1 | 10/2015 | Yang et al. | |
| 2017/0040997 A1 | 2/2017 | Yang et al. | |
| 2018/0212601 A1 | 7/2018 | Yang et al. | |
| 2018/0315548 A1 | 11/2018 | Wang et al. | |
| 2018/0358963 A1 | 12/2018 | Yang et al. | |
| 2021/0313286 A1* | 10/2021 | Watts | H01L 23/3677 |

\* cited by examiner

METHOD AND DEVICE FOR DETECTING LAYOUT OF INTEGRATED CIRCUIT, AND STORAGE MEDIUM

CROSS-REFERENCE TO RELATED APPLICATIONS

This is a continuation application of International Patent Application No. PCT/CN2021/138423 filed on Dec. 15, 2021, which claims priority to Chinese Patent Application No. 202111293505.8 filed on Nov. 3, 2021. The disclosures of these applications are hereby incorporated by reference in their entirety.

BACKGROUND

With the development of semiconductor technology, the number of electronic components in an integrated circuit continues to increase, and an internal structure of the integrated circuit is increasingly complex, which brings a greater challenge to design of a layout of the integrated circuit.

A finger structure is usually contained in the layout of the integrated circuit.

SUMMARY

The present disclosure relates to the field of integrated circuit design, and more particularly, to a method and device for detecting a layout of an integrated circuit and a storage medium.

Embodiments of the present disclosure provide a method and device for detecting a layout of an integrated circuit and a storage medium, which can detect an unqualified finger structure with insufficient upper connected vias in a layout, and find design defects in time, thereby improving the yield of the chip.

The technical solution of the present disclosure is implemented as follows.

An embodiment of the present disclosure provides a method for detecting a layout of an integrated circuit, which includes the following operations.

A finger structure is determined in the layout. The finger structure includes at least one upper connected source-drain terminal and at least one upper connected via. The at least one upper connected source-drain terminal is electrically connected to an upper metal line through the at least one upper connected via.

A number of the at least one upper connected source-drain terminal and a number of the at least one upper connected via are calculated.

For the finger structure, in response to the number of the at least one upper connected source-drain terminal being greater than the number of the at least one upper connected via, it is determined that the finger structure is an unqualified finger structure.

An embodiment of the present disclosure further provides a device for detecting a layout of an integrated circuit, which includes a processor, a memory for storing program instructions executable by the processor and a communication interface.

The processor is configured to run the program instructions to determine a finger structure in the layout. The finger structure includes at least one upper connected source-drain terminal and at least one upper connected via. The at least one upper connected source-drain terminal is electrically connected to an upper metal line through the at least one upper connected via.

The processor is further configured to calculate a number of the at least one upper connected source-drain terminal and a number of the at least one upper connected via.

The processor is further configured to, for the finger structure, in response to the number of the at least one upper connected source-drain terminal being greater than the number of the at least one upper connected via, determine that the finger structure is an unqualified finger structure.

An embodiment of the present disclosure further provides a storage medium having stored thereon executable instructions that, when being executed by a processor, cause the processor to implement the method for detecting a layout of an integrated circuit in the above embodiment.

DETAILED DESCRIPTION

In order to make the objects, technical solutions and advantages of the present disclosure clearer, the technical solutions of the present disclosure are further described in detail below in conjunction with the accompanying drawings and embodiments. The described embodiments shall not be construed as limiting the present disclosure. All other embodiments obtained by a person of ordinary skill in the art without creative efforts shall fall within the scope of protection of the present disclosure.

In the following description, the term "some embodiments" is used to describe a subset of all possible embodiments, but it is to be understood that "some embodiments" may be the same subset or different subsets of all possible embodiments and may be combined with each other without conflict.

If a description like "first/second" appears in the application document, the following description is added. In the following description, the referred term "first/second/third" is only used to distinguish similar objects, and does not represent a specific ordering of objects. It is to be understood that "first/second/third" may be interchanged in a specific order or sequence, where permitted, to enable the embodiments of the disclosure described herein to be implemented in a sequence other than that illustrated or described herein.

Unless otherwise defined, all technical and scientific terms used herein have the same meaning as generally understood by those skilled in the art. The terms used herein are for the purpose of describing embodiments of the present disclosure only, and are not intended to limit the present disclosure.

The integrated circuit industry is constantly being developed and evolved, layout design is a basis in the physical implementation of the integrated circuit, and the design quality will directly affect the power consumption and performance of the basic circuits.

Figure 1A:
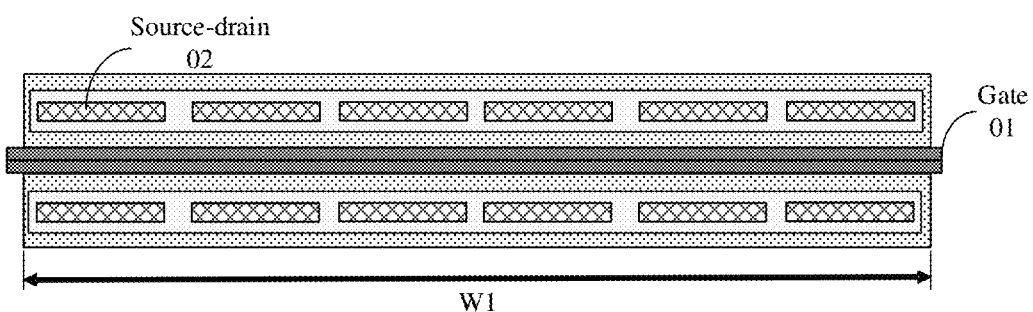
FIG. 1A is a first schematic diagram of a method for detecting a layout of an integrated circuit according to an embodiment of the present disclosure.
Figure 1B:
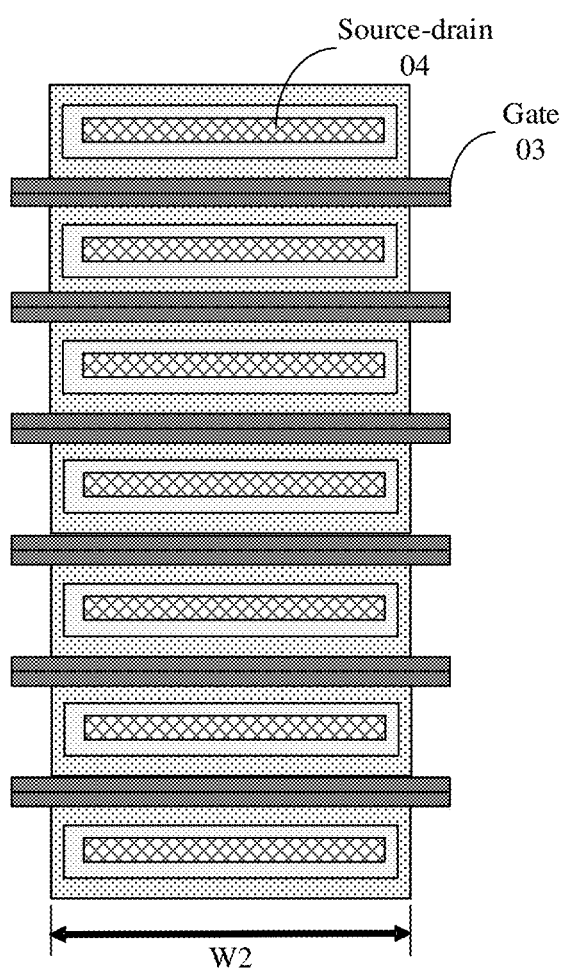
FIG. 1B is a second schematic diagram of a method for detecting a layout of an integrated circuit according to an embodiment of the present disclosure.

A finger structure, also known as a finger gate structure, is a structure in the layout that characterizes a parallel connection of a plurality of Metal-Oxide-Semiconductor (MOS) transistors and has a different shape from that of a conventional parallel connection structure. FIG. 1A and FIG. 1B illustrate a layout of the conventional parallel connection structure and a layout of the finger structure, respectively, each representing a parallel connection of six MOS transistors. The conventional parallel connection structure illustrated in FIG. 1A has one gate 01. While the finger structure illustrated in FIG. 1B has six gates 03. The width W1 of the MOS transistor in FIG. 1A is six times the width W2 of the MOS transistor in FIG. 1B, while the length of the MOS transistor in FIG. 1A and the length of the MOS transistor in FIG. 1B are the same. A saturation current of the MOS transistor is calculated by using the following equation (1):

$$I_{D,SAT} = \mu C_{OX} \frac{W}{L} \frac{(V_{GS} - V_T)^2}{2} \tag{1}$$

In the above equation (1), $I_{D,SAT}$ denotes the saturation current of the MOS transistor, $\mu$ denotes an electron transfer rate, $C_{OX}$ denotes a gate oxide capacitance per unit area, $$\frac{W}{L}$$

denotes a width-to-length ratio of the MOS transistor, and $(V_{GS}-V_T)$ denotes a driving voltage. According to the above equation (1), when the other conditions are not changed, the saturation current $I_{D,SAT}$ of the MOS transistor is proportional to the width-to-length ratio $$\frac{W}{L},$$

and the larger the width-to-length ratio $$\frac{W}{L}$$

is, the larger the saturation current $I_{D,SAT}$ is.

Compared to the finger structure in FIG. 1B, the width W1 of the MOS transistor in the conventional parallel connection structure illustrated in FIG. 1A is larger (W1 is 6 times W2). Thus, the width-to-length ratio of the MOS transistor in the conventional parallel connection structure illustrated in FIG. 1A is also larger, so that the saturation current is too high. Therefore, in the layout design, the designer may design the MOS transistor into a finger structure according to the needs of the layout, such as the same height requirement of the standard cell and the manufacturing process design rule check (DRC) requirements, so as to avoid excessive saturation current.

However, an upper connected source-drain terminal is included in the finger structure, and the upper connected source-drain terminal needs to be electrically connected to the upper metal line through an upper connected via. If the number of the upper connected vias is too small, a parasitic resistance of the source-drain terminal will be increased, and a performance of the MOS transistor is affected.

Figure 2A:
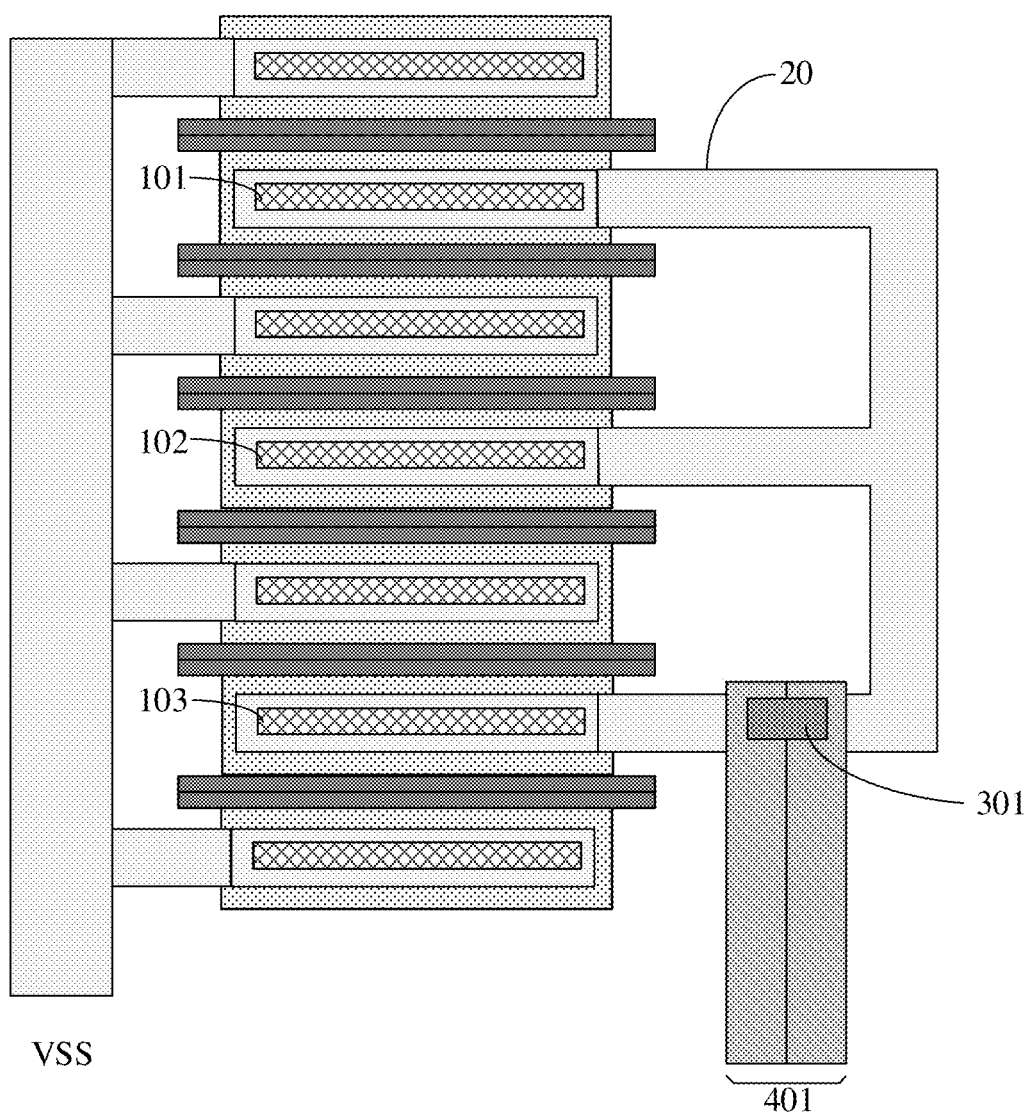
FIG. 2A is a third schematic diagram of a method for detecting a layout of an integrated circuit according to an embodiment of the present disclosure.

As shown in FIG. 2A, the upper connected source-drain terminals 101, 102, and 103 are electrically connected to the upper metal line 401 through only one upper connected via 301, which has a large negative impact on a reliability of the layout.

a. An equivalent cross-section of a wire is too small, resulting in a very large resistance, and affecting original timing requirements of a circuit designer.

b. Non-uniform current flow, and severe heat generation at the via.

c. If the single upper connected via 301 fails during production, no other upper connected via can continue to work, which will directly cause the MOS transistor stop working. In severe cases, it even affects the work of the whole circuit, resulting in a failure of taping out of the entire chip.

Figure 2B:
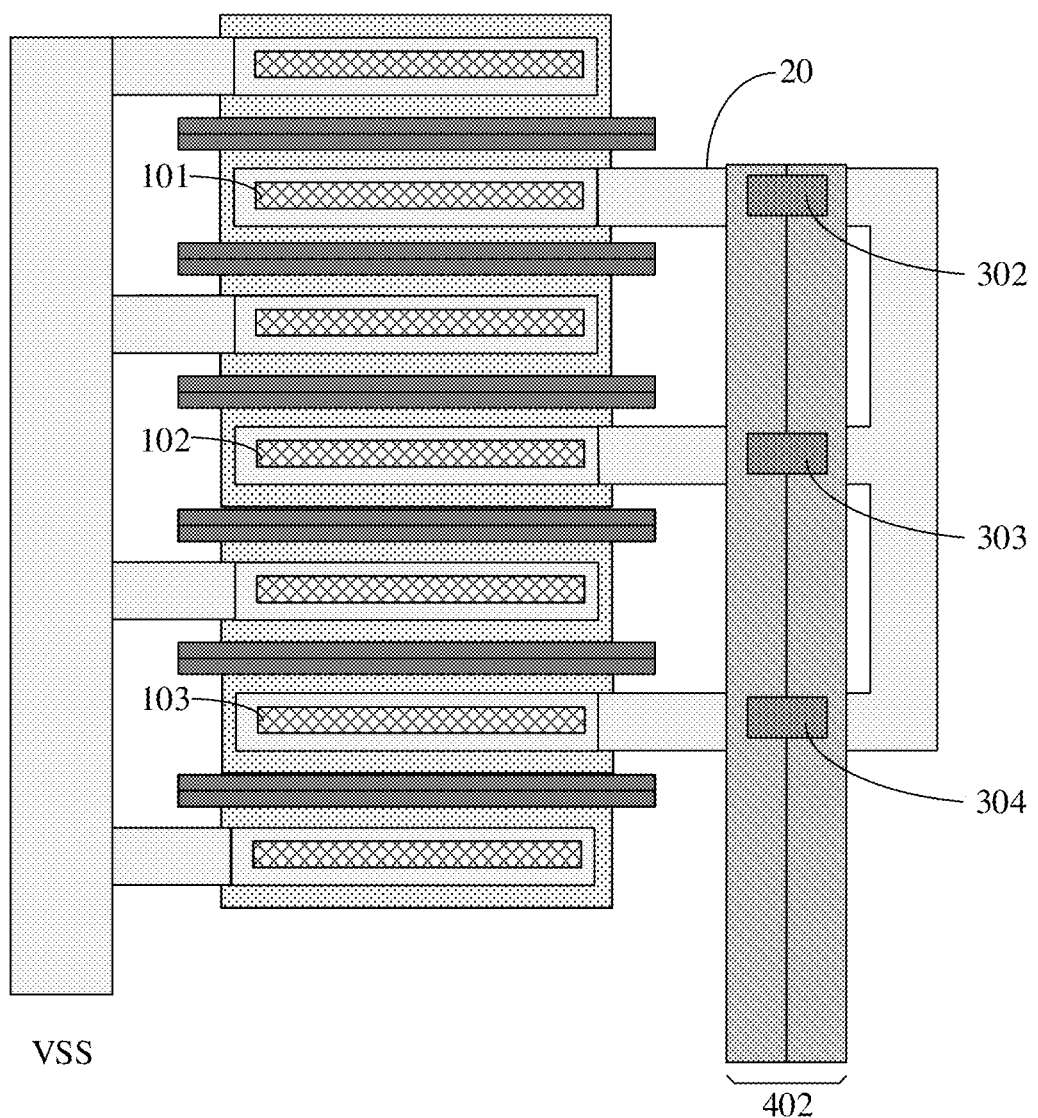
FIG. 2B is a fourth schematic diagram of a method for detecting a layout of an integrated circuit according to an embodiment of the present disclosure.

As shown in FIG. 2B, the upper connected source-drain terminals 101, 102, and 103 are electrically connected to the upper metal line 402 through three upper connected vias 302, 303, and 304, respectively. Therefore, the parasitic resistance of the source-drain terminal is small, and even if one of the upper connected vias fails, the MOS transistor can still utilize other upper connected vias, so that the use of the entire MOS transistor is not affected.

Since a simulation of the layout needs to be completed manually, that is, manual operation is required to connect tens of millions of transistors to each other according to a circuit diagram, it is inevitable that too few upper connected vias are provided. Too few upper connected vias will not affect passing of the layout versus schematic (LVS) and the manufacturing process rule check. Therefore, it is difficult to find this situation in time through these two kinds of checks. It is desirable to check an unqualified finger structure with insufficient upper connected vias in the layout by a new method, to find out the design defect in time, and to improve the quality of the layout.

Figure 3:
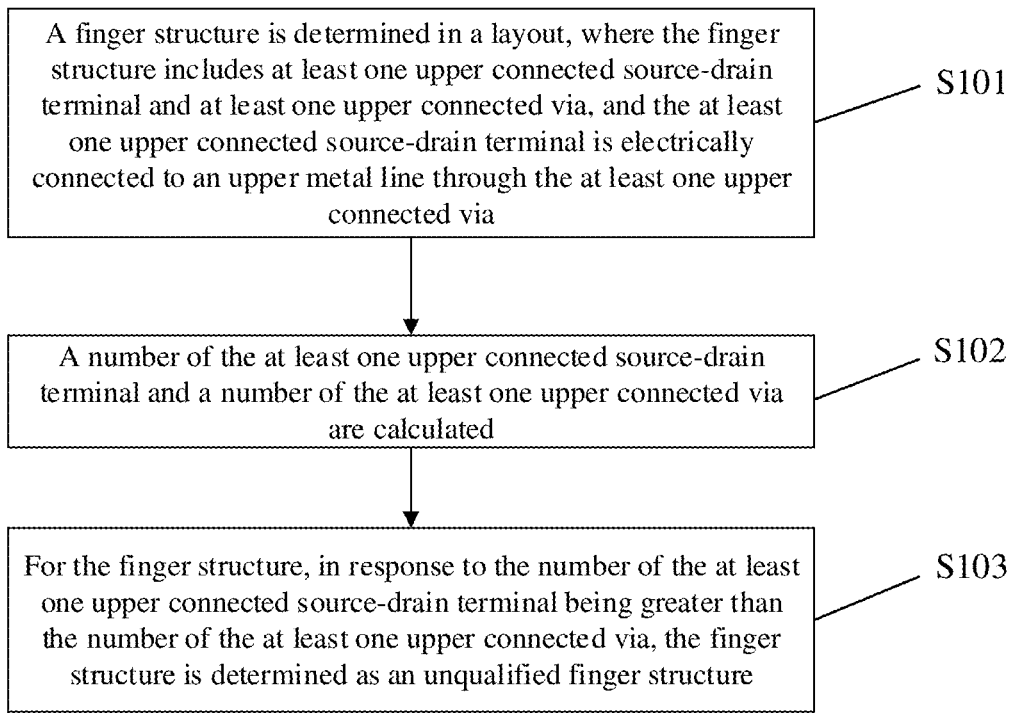
FIG. 3 is a first flowchart of a method for detecting a layout of an integrated circuit according to an embodiment of the present disclosure.

FIG. 3 is an optional flowchart of a method for detecting a layout of an integrated circuit according to an embodiment of the present disclosure, which will be described with reference to the operations shown in FIG. 3.

In S101, a finger structure is determined in the layout. The finger structure includes at least one upper connected source-drain terminal and at least one upper connected via. The at least one upper connected source-drain terminal is electrically connected to an upper metal line through the at least one upper connected via.

In the embodiment of the present disclosure, a detection device may first determine the finger structure in the layout. As illustrated in FIG. 2B, the finger structure includes upper connected source-drain terminals 101, 102, and 103, and upper connected vias 302, 303, and 304. The upper connected source-drain terminals 101, 102, and 103 are electrically connected to the upper metal line 402 through the upper connected vias 302, 303, and 304 respectively.

In an embodiment of the present disclosure, the detection device may first determine a target layer pattern in the layout based on preset identification layer information. The preset identification layer information is obtained by mapping different digital identification layers to layers of the tape-out process respectively, and the target layer pattern includes all design patterns of the layer to be detected.

Figure 4:
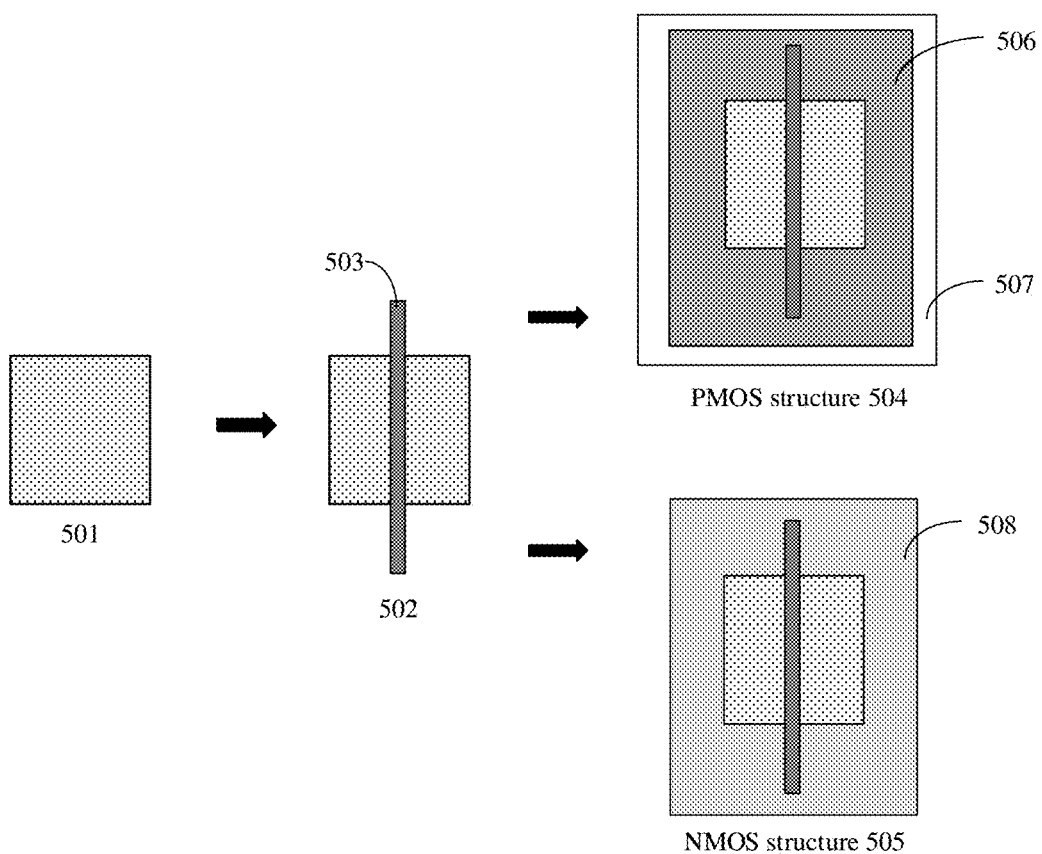
FIG. 4 is a fifth schematic diagram of a method for detecting a layout of an integrated circuit according to an embodiment of the present disclosure.

Then, the detection device may identify a MOS structure in the target layer pattern through a Boolean operation. FIG. 4 is a flowchart for identifying the MOS structure. Referring to FIG. 4, the detection device may first identify at least one active region 501 in the target layer pattern. Then a target active region 502 intersecting at least one gate structure 503 is screened out from the at least one active region 501. A material of the gate structure is typically polysilicon. Then, a guard ring and diode structure in the target active region 502 are removed to obtain a positive channel Metal-Oxide-Semiconductor (PMOS) structure 504 or a negative channel Metal-Oxide-Semiconductor (NMOS) structure 505.

It should be noted that FIG. 4 shows the case where the layout characterizes a P-type substrate, the PMOS structure 504 is surrounded by a P-type implantation region 506 and an N-well region 507, and the NMOS structure 505 is surrounded by an N-type implantation region 508. If the layout characterizes an N-type substrate, the PMOS structure is surrounded by a P-type implantation region, and the NMOS structure is surrounded by an N-type implantation region and a P-well region.

Figure 5A:
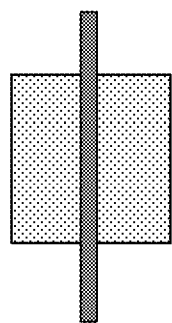
FIG. 5A is a sixth schematic diagram of a method for detecting a layout of an integrated circuit according to an embodiment of the present disclosure.
Figure 5B:
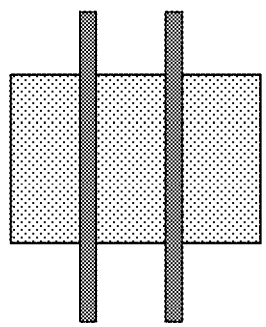
FIG. 5B is a seventh schematic diagram of a method for detecting a layout of an integrated circuit according to an embodiment of the present disclosure.
Figure 5C:
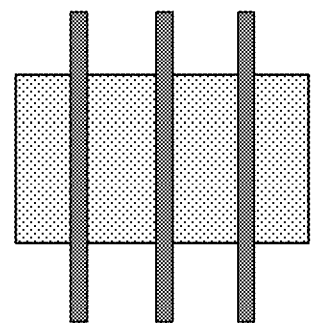
FIG. 5C is an eight schematic diagram of a method for detecting a layout of an integrated circuit according to an embodiment of the present disclosure.

After the MOS structure is identified, the detection device may calculate a number of side-by-side gate structures in the MOS structure, so as to determine the finger structure. The side-by-side gate structures are arranged in parallel in the layout. For any MOS structure, in response to the number of side-by-side gate structures in the MOS structure being greater than or equal to 2, it is determined that the MOS structure is the finger structure. As illustrated in FIGS. 5A, 5B and 5C, the MOS structure in FIG. 5A has only one gate structure, and thus it will not be determined as a finger structure. The MOS structure in FIG. 5B has two side-by-side gate structures and the MOS structure in FIG. 5C has three side-by-side gate structures, and both the MOS structures will be determined as the finger structure.

In S102, a number of the at least one upper connected source-drain terminal and a number of the at least one upper connected via are calculated.

In an embodiment of the present disclosure, after determining the finger structure, the detection device may calculate the number of the at least one upper connected source-drain terminal and the number of the at least one upper connected via in the finger structure.

In an embodiment of the present disclosure, as illustrated in FIGS. 2A and 2B, an upper connected finger metal line 20 in the finger structure is electrically connected to the upper connected source-drain terminals 101, 102 and 103, and the upper connected vias 301, 302, 303 and 304 are located on the upper connected finger metal line 20. The detection device may determine the upper connected finger metal line 20 in the finger structure according to these connection characteristics.

The detection device may calculate the number of the upper connected vias on the upper connected finger metal line and store the number in count1. Then, the detection device may calculate the number of the upper connected source-drain terminals connecting to the upper connected finger metal line through the Boolean operation, and store the number in count2. Taking FIGS. 2A and 2B as examples, the number of the upper connected via 301 in FIG. 2A is one, and the number of the upper connected source-drain terminals 101, 102 and 103 is three. In FIG. 2B, the number of the upper connected vias 302, 303 and 304 is three, and the number of the upper connected source-drain terminals 101, 102 and 103 is three.

In S103, for the finger structure, in response to the number of the at least one upper connected source-drain terminal being greater than the number of the at least one upper connected via, it is determined that the finger structure is an unqualified finger structure.

In an embodiment of the present disclosure, after determining the number of the upper connected source-drain terminals and the number of the upper connected vias of any finger structure, the detection device may compare them. If the number of the upper connected source-drain terminals is greater than the number of the upper connected vias, it is determined that the finger structure is the unqualified finger structure.

Figure 6:
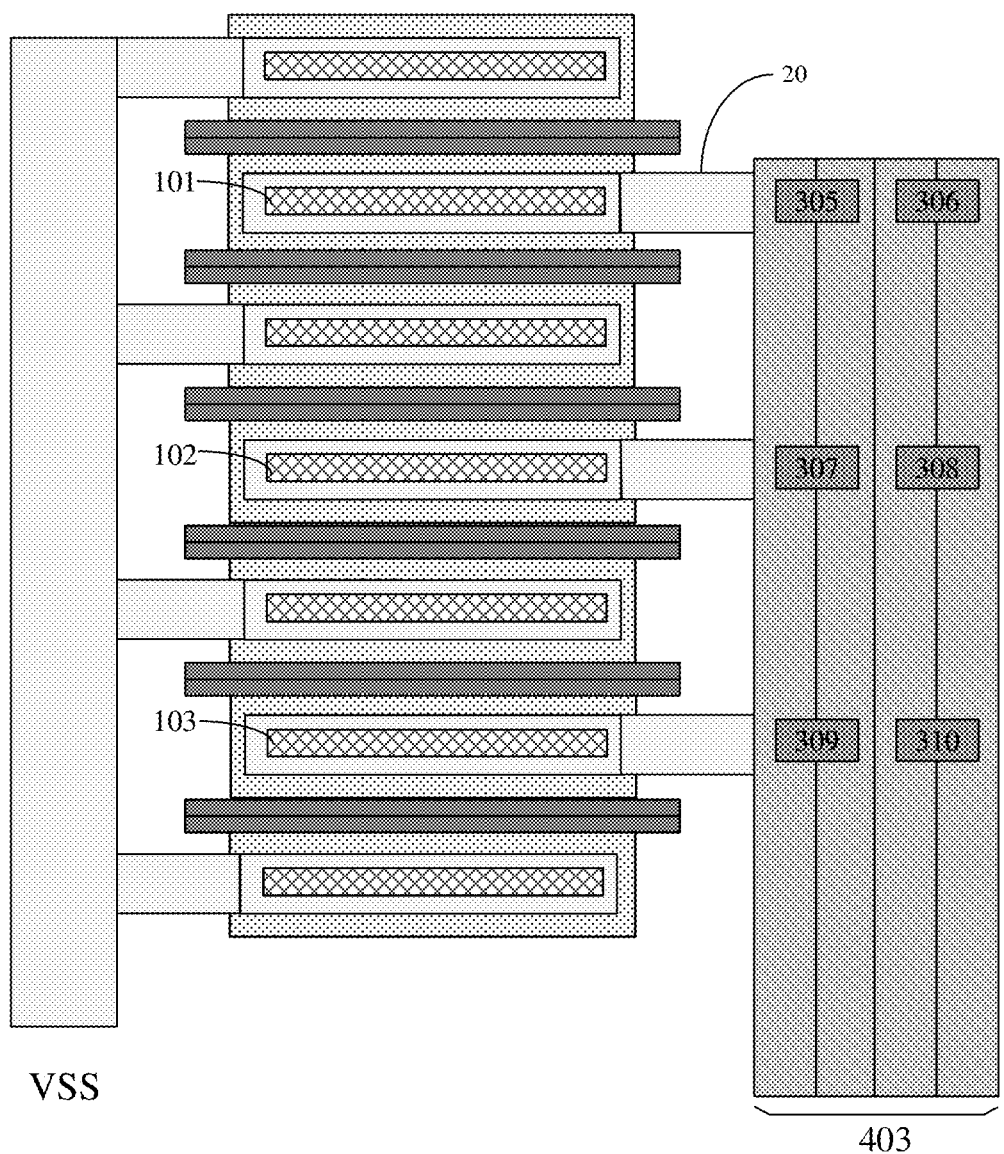
FIG. 6 is a ninth schematic diagram of a method for detecting a layout of an integrated circuit according to an embodiment of the present disclosure.

In an embodiment of the present disclosure, the detection device may compare the variable count1 with the variable count2 stored in the system, where the number of the upper connected vias is stored in count1 and the number of the upper connected source-drain terminals is stored in count2. If count2 is greater than count1, it is determined that the corresponding finger structure is the unqualified finger structure, and the unqualified finger structure is located. If count2 is less than or equal to count1, the finger structure is well designed and is not determined to be unqualified. Referring to FIG. 2A, FIG. 2B and FIG. 6, in FIG. 2A, the number of the upper connected source-drain terminals 101, 102, and 103, i.e., count2 is three, the number of the upper connected via 301, i.e., count1 is one, count2 is greater than count1, and it is determined that the finger structure is the unqualified finger structure. In FIG. 2B, the number of the upper connected source-drain terminals 101, 102 and 103, i.e., count2 is three, and the number of the upper connected vias 302, 303 and 304, i.e., count1 is three, count2 is equal to count1, and the finger structure is not determined to be the unqualified finger structure. In FIG. 6, the number of the upper connected source-drain terminals 101, 102 and 103, i.e., count2 is three, the number of the upper connected vias 305, 306, 307, 308, 309 and 310, i.e., count1 is six, count2 is less than count1, and the finger structure is not determined to be the unqualified finger structure.

It can be understood that, the finger structure in the layout is identified and determined layer by layer through the Boolean operation, and then the number of the upper connected source-drain terminals and the number of the upper connected vias in the finger structure are determined and compared. In this way, the unqualified finger structure with a design defect can be accurately determined for correction, and the quality of the layout is improved, thereby improving the yield of the chip.

Figure 7:
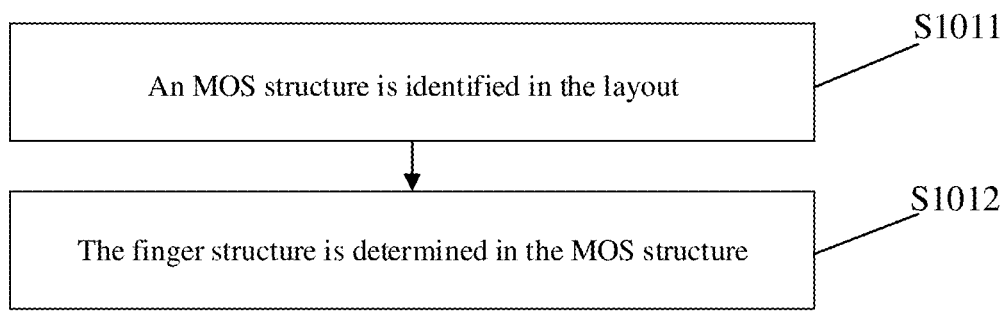
FIG. 7 is a second flowchart of a method for detecting a layout of an integrated circuit according to an embodiment of the present disclosure.

In some embodiments of the present disclosure, the operation S101 shown in FIG. 3 may be implemented by operations S1011-S1012 shown in FIG. 7, which will be described in combination with the operations.

In S1011, a MOS structure is identified in the layout.

In an embodiment of the present disclosure, the detection device may first identify the MOS structure in the layout. The MOS structure includes a PMOS structure and an NMOS structure.

In S1012, the finger structure is determined in the MOS structure.

In an embodiment of the present disclosure, after identifying the MOS structure, the detection device may determine the finger structure in the MOS structure.

In some embodiments of the present disclosure, the operation S1011 shown in FIG. 7 may be implemented by operations S1015-S1016, which will be described in combination with the operations.

In S1015, a target layer pattern is determined in the layout based on preset identification layer information.

In an embodiment of the present disclosure, the detection device may first determine the target layer pattern in the layout based on the preset identification layer information. The preset identification layer information is obtained by mapping different digital identification layers to the layers of the tape-out process respectively, and the target layer pattern includes all design patterns of the layer to be detected.

In S1016, the MOS structure is identified in the target layer pattern through a Boolean operation.

In an embodiment of the present disclosure, the detection device may identify the MOS structure in the target layer pattern through the Boolean operation.

It can be understood that, the target layer pattern of the layer to be detected is first determined according to the preset identification layer information, and then the MOS structure is identified in the target layer pattern. In this way, an identification range can be narrowed and an identification efficiency can be improved.

Figure 8:
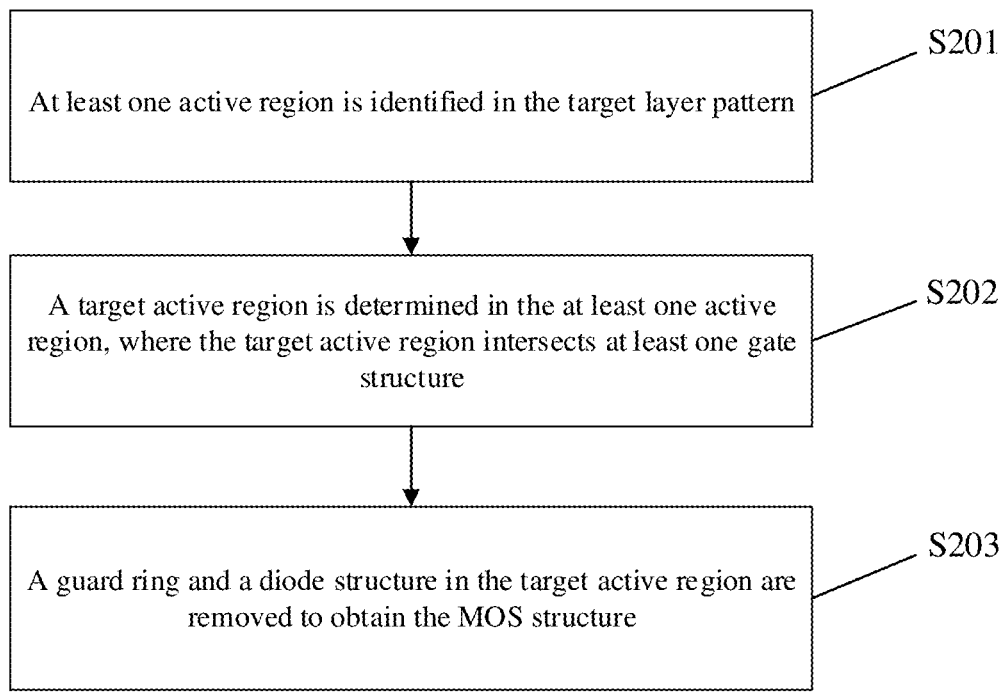
FIG. 8 is a third flowchart of a method for detecting a layout of an integrated circuit according to an embodiment of the present disclosure.

In some embodiments of the present disclosure, the operation S1014 in the above embodiment may be implemented by operations S201-S203 shown in FIG. 8, which will be described in combination with the operations.

In S201, at least one active region is identified in the target layer pattern.

In an embodiment of the present disclosure, referring to FIG. 4, the detection device may first identify the active region 501 in the target layer pattern.

In S202, a target active region is determined in the at least one active region. The target active region intersects at least one gate structure.

In an embodiment of the present disclosure, with continued reference to FIG. 4, after identifying the at least one active region 501, the detection device may screen the target active region 502 that intersects the at least one gate structure 503 in the at least one active region 501. A material of the gate structure is typically polysilicon.

In S203, the guard ring and the diode structure in the target active region are removed to obtain the MOS structure.

In the embodiment of the present disclosure, with continued reference to FIG. 4, after determining the target active region 502, the detection device may remove the guard ring and the diode structure in the target active region, thereby obtaining the PMOS structure 504 or the NMOS structure 505.

It should be noted that FIG. 4 shows the case where the layout characterizes a P-type substrate, the PMOS structure 504 is surrounded by a P-type implantation region 506 and an N-well region 507, and the NMOS structure 505 is surrounded by an N-type implantation region 508. If the layout characterizes an N-type substrate, the PMOS structure is surrounded by a P-type implantation region, and the NMOS structure is surrounded by an N-type implantation region and a P-well region.

It can be understood that, the MOS structure is gradually recognized by using the Boolean operation according to the characteristic of the MOS structure in the layout, so that problems such as inefficiency and omission caused by manual searching one by one are avoided, and automatic identification and confirmation are realized, thereby improving efficiency and accuracy.

Figure 9:
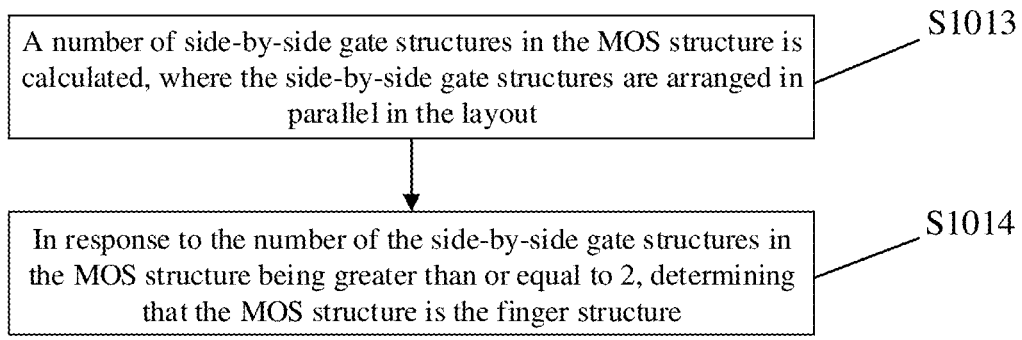
FIG. 9 is a fourth flowchart of a method for detecting a layout of an integrated circuit according to an embodiment of the present disclosure.

In some embodiments of the present disclosure, the operation S1012 shown in FIG. 7 may be implemented by the operations S1013-S1014 shown in FIG. 9, which will be described in combination with the operations.

In S1013, a number of side-by-side gate structures in the MOS structure is determined. The side-by-side gate structures are arranged in parallel in the layout.

In an embodiment of the present disclosure, after identifying the MOS structure, the detection device may calculate the number of the side-by-side gate structures in the MOS structure, thereby determining the finger structure. The side-by-side gate structures are arranged in parallel in the layout.

In S1014, in response to the number of the side-by-side gate structures in the MOS structure being greater than or equal to 2, it is determined that the MOS structure is the finger structure.

In an embodiment of the present disclosure, for any MOS structure, if the number of the side-by-side gate structures is greater than or equal to 2, the detection device may determine that the MOS structure is the finger structure. As illustrated in FIGS. 5A, 5B and 5C, the MOS structure in FIG. 5A has only one gate structure, and thus is not determined as the finger structure. Since the MOS structure in FIG. 5B has two side-by-side gate structures and the MOS structure in FIG. 5C has three side-by-side gate structures, it is determined that the MOS structure in FIG. 5B and the MOS structure in FIG. 5C are the finger structures.

Figure 10:
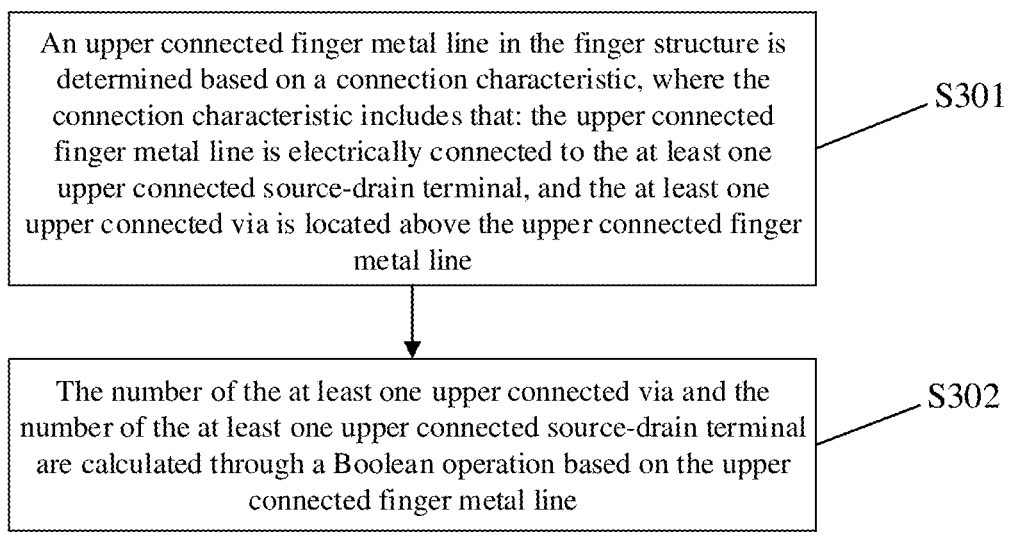
FIG. 10 is a fifth flowchart of a method for detecting a layout of an integrated circuit according to an embodiment of the present disclosure.

In some embodiments of the present disclosure, the operation S102 shown in FIG. 3 may be implemented by operations S301-S302 shown in FIG. 10, which will be described in combination with the operations.

In S301, an upper connected finger metal line in the finger structure is determined based on a connection characteristic. The connection characteristic includes that: the upper connected finger metal line is electrically connected to the at least one upper connected source-drain terminal, and the at least one upper connected via is located on the upper connected finger metal line.

In an embodiment of the present disclosure, as illustrated in FIGS. 2A and 2B, the upper connected finger metal line 20 in the finger structure is electrically connected to the upper connected source-drain terminals 101, 102 and 103, and the upper connected vias 301, 302, 303 and 304 are located on the upper connected finger metal line 20. The detection device may determine the upper connected finger metal line 20 in the finger structure according to these connection characteristics.

In S302, the number of the at least one upper connected via and the number of the at least one upper connected source-drain terminal are calculated through a Boolean operation based on the upper connected finger metal line.

In an embodiment of the present disclosure, after determining the upper connected finger metal line, the detection device may calculate the number of the upper connected vias on the upper connected finger metal line, and store the number in the count1. Then, the detection device may calculate the number of the upper connected source-drain terminals intersecting the upper connected finger metal line by the Boolean operation, and store the number in the count2. Taking FIGS. 2A and 2B as examples, the number of the upper connected via 301 in FIG. 2A is one, and the number of the upper connected source-drain terminals 101, 102 and 103 is three. In FIG. 2B, the number of the upper connected vias 302, 303 and 304 is three, and the number of the upper connected source-drain terminals 101, 102 and 103 is three.

It can be understood that, according to the physical characteristic and connection relationship of the finger structure, the number of the upper connected source-drain terminals and the number of the upper connected vias are determined and compared, so that the unqualified finger structure can be quickly determined, and a detection efficiency is improved.

In some embodiments of the present disclosure, the method further includes an operation S104 after the operation S103 shown in FIG. 3, which will be described in combination with the operation.

In S104, the unqualified finger structure is displayed in the layout.

In an embodiment of the present disclosure, the detection device may display the unqualified finger structure in the layout after determining the unqualified finger structure. For example, all unqualified finger structures are highlighted simultaneously in the layout. Alternatively, information of all the unqualified finger structures is recorded in a list, and after receiving a click operation of the designer on the list, the corresponding unqualified finger structure is highlighted in the layout.

It can be understood that after determining the unqualified finger structure, the unqualified finger structure is displayed in the layout, so that the designer can view the unqualified finger structure in the layout conveniently, thereby improving a man-machine interaction performance.

In some embodiments of the present disclosure, the method further includes an operation S105 after the operation S103 shown in FIG. 3, which will be described in combination with the operation.

In S105, the unqualified finger structure is corrected to a qualified finger structure.

In an embodiment of the present disclosure, after determining the unqualified finger structure, the detection device may further correct the unqualified finger structure to a qualified finger structure.

Figure 11:
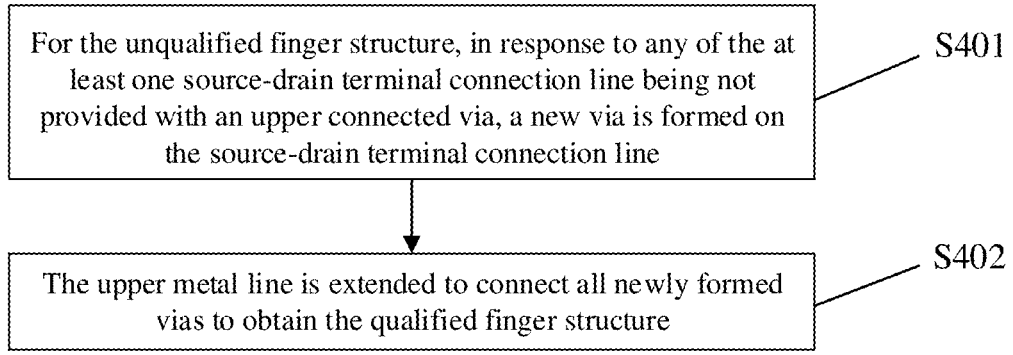
FIG. 11 is a sixth flowchart of a method for detecting a layout of an integrated circuit according to an embodiment of the present disclosure.

In some embodiments of the present disclosure, the upper connected finger metal line includes at least one source-drain terminal connection line. Each of the at least one source-drain terminal connection line is electrically connected to a respective one of the at least one upper connected source-drain terminal. The operation S105 in the above embodiment can be implemented by operations S401-S402 shown in FIG. 11, which will be described in combination with the operations.

In S401, for the unqualified finger structure, in response to any of the at least one source-drain terminal connection line being not provided with an upper connected via, a new via is formed on the source-drain terminal connection line.

In an embodiment of the present disclosure, after determining the unqualified finger structure, the detection device may determine whether an upper connected via is provided on the source-drain terminal connection line of the unqualified finger structure. In response to any of the at least one source-drain terminal connection line being not provided with an upper connected via, the detection device may form a new via on the source-drain terminal connection line.

In S402, the upper metal line is extended to connect all newly formed vias, to obtain the qualified finger structure.

In an embodiment of the present disclosure, the detection device may extend the upper metal line to connect all the newly formed vias after forming the new vias, thereby obtaining the qualified finger structure. Referring to FIGS. 2A and 2B, the detection device may form two new vias on the source-drain terminal connection line 20 in FIG. 2A, and extend the upper metal line 401 to connect all newly formed vias, thereby obtaining the qualified finger structure similar to that in FIG. 2B.

It can be understood that, in view of the design defect of the unqualified finger structure with insufficient upper connected vias, the upper connected vias may be added accordingly and the upper metal line may be extended to connect to the added upper connected vias, so that the number of the upper connected vias is greater than or equal to the number of the upper connected source-drain terminals. As such, the design defect may be corrected accordingly, and the quality of the layout is improved, thereby improving the yield of the product.

Figure 12:
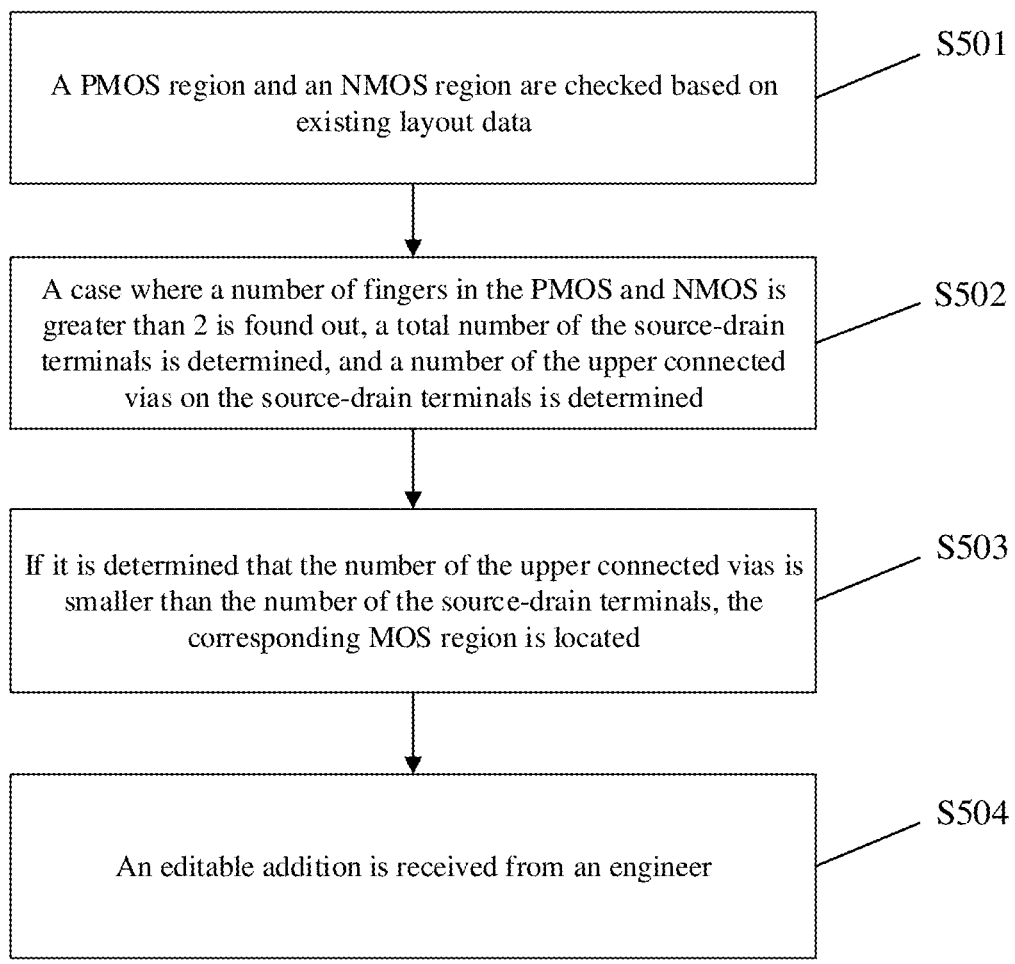
FIG. 12 is a seventh flowchart of a method for detecting a layout of an integrated circuit according to an embodiment of the present disclosure.

FIG. 12 is an optional flowchart of a method for detecting a layout of an integrated circuit according to an embodiment of the present disclosure, which will be described with reference to the operations shown in FIG. 12.

In S501, a region of PMOS and a region of NMOS are detected based on existing layout data.

In an embodiment of the present disclosure, the detection device may identify the PMOS and NMOS through the Boolean operation according to an identification layer.

In an embodiment of the present disclosure, the detection device may first map different digital identification layers to the layers of the tape-out process respectively. Then, a EDA software identifiable command and a Boolean operation are used for compiling. The active regions are found first; part of the active regions affected by Poly is screened out and stored as A; the guard ring and diode in A are filtered out, and the remaining portion is the region of PMOS or the region of NMOS. As shown in FIG. 4, the PMOS is obtained when A is surrounded by an N-well 507 and P-type implantation region 506, and the NMOS is obtained when A is surrounded by an N-type implantation region 508.

In S502, a case where the number of finger in the PMOS and NMOS is greater than 2 is found out, and then the total number of the source-drain terminals and the number of the upper connected vias are determined respectively.

In an embodiment of the present disclosure, after detecting the PMOS and NMOS, the detection device may find out a finger structure of which the number of fingers is greater than or equal to 2, and a structure in which the number of fingers is less than 2 is filtered out. The detection device may select the structure of which the number of fingers is greater than 2 and store it in the system for subsequent calculation.

The detection device may then find the source-drain terminal connection line connected to the upper connected source-drain terminal on the active region, and determine the number of the upper connected vias connected between the source-drain terminal connection line and the upper metal line, and store the number of the upper connected vias as count1. The detection device may continue to calculate the number of intersections between the source-drain terminal connection line and the upper connected source-drain terminal on the active region through the Boolean operation, and stored the number as count2.

It should be noted that the connection between the upper connected source-drain terminals and the upper connected finger metal line also requires vias. However, these vias are vias in a lower layer and usually have been designed in a parameter cell (Pcell), which can be obtained by giving specific parameters to Pcell without manually adding them in the layout by the designer.

In S503, if it is determined that the number of the upper connected vias is smaller than the number of the source-drain terminals, the corresponding MOS region is located.

In an embodiment of the present disclosure, the detection device may compare the variable count1 with the variable count2 stored in the system, and if the count1 is less than count2 in a certain finger structure, the finger structure will be located.

In S504, an editorial addition of the engineer is received.

In an embodiment of the present disclosure, after locating the unqualified finger structure, the detection device may remind the engineer to make a modification and receive an editorial addition of the engineer. The engineer may add the missing upper connected vias in the unqualified finger structure to modify the unqualified finger structure to be qualified.

It will be understood that the present disclosure may help layout engineers quickly locating an unqualified finger structure that does not conform to a reliability check of the wiring. In this way, when a via is omitted due to negligence in the design process, it can be checked out in time for modification, thereby greatly improving the quality of the layout.

Figure 13:
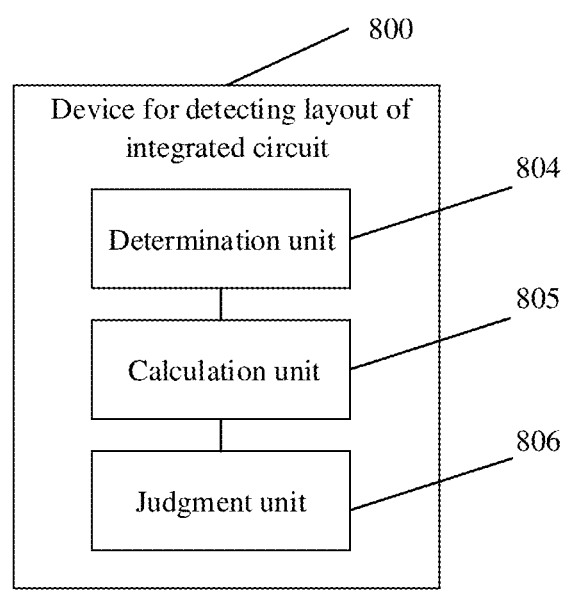
FIG. 13 is a first structural diagram of a device for detecting a layout of an integrated circuit according to an embodiment of the present disclosure.

FIG. 13 is an optional structural diagram of a device for detecting a layout of an integrated circuit according to an embodiment of the present disclosure. As shown in FIG. 13, an embodiment of the present disclosure further provides a device 800 for detecting a layout of an integrated circuit. The device includes a determination unit 804, a calculation unit 805, and a judgment unit 806.

The determination unit 804 is configured to determine a finger structure in the layout. The finger structure includes at least one upper connected source-drain terminal and at least one upper connected via, and the at least one upper connected source-drain terminal is electrically connected to an upper metal line through the at least one upper connected via.

The calculation unit 805 is configured to calculate a number of the at least one upper connected source-drain terminal and a number of the at least one upper connected via.

The judgment unit 806 is configured to, for the finger structure, in response to the number of the at least one upper connected source-drain terminal being greater than the number of the at least one upper connected via, determine that the finger structure is an unqualified finger structure.

In some embodiments of the present disclosure, the determination unit 804 is further configured to identify a MOS structure in the layout, and determine the finger structure in the MOS structure.

In some embodiments of the present disclosure, the determination unit 804 is further configured to determine a target layer pattern in the layout based on preset identification layer information, and identify the MOS structure in the target layer pattern through a Boolean operation.

In some embodiments of the present disclosure, the determination unit 804 is further configured to identify at least one active region in the target layer pattern; determine a target active region in the at least one active region, the target active region intersecting at least one gate structure; and remove a guard ring and diode structure in the target active region to obtain the MOS structure.

In some embodiments of the present disclosure, in response to the layout characterizing a P-type substrate, the PMOS structure is surrounded by a P-type implantation region and an N-well region, and the NMOS structure is surrounded by an N-type implantation region.

In some embodiments of the present disclosure, the calculation unit 805 is further configured to calculate a number of side-by-side gate structures in the MOS structure. The side-by-side gate structures are arranged in parallel in the layout.

The judgment unit 806 is further configured to, in response to the number of the side-by-side gate structures in the MOS structure being greater than or equal to 2, determine that the MOS structure is the finger structure.

In some embodiments of the present disclosure, the determination unit 804 is further configured to determine an upper connected finger metal line in the finger structure based on a connection characteristic. The connection characteristic includes that: the upper connected finger metal line is electrically connected to the at least one upper connected source-drain terminal, and the at least one upper connected via is located on the upper connected finger metal line.

The calculation unit 805 is further configured to calculate the number of the at least one upper connected via and the number of the at least one upper connected source-drain terminal through a Boolean operation based on the upper connected finger metal line.

In some embodiments of the present disclosure, the device 800 for detecting a layout of an integrated circuit further includes a display unit 807.

The display unit 807 is configured to display the unqualified finger structure on the layout.

In some embodiments of the present disclosure, the device 800 for detecting a layout of an integrated circuit further includes a correction unit 808.

The correction unit 808 is configured to correct the unqualified finger structure to a qualified finger structure.

In some embodiments of the present disclosure, the upper connected finger metal line includes at least one source-drain terminal connection line. Each of the at least one source-drain terminal connection line is electrically connected to a respective one of the at least one upper connected source-drain terminal. The correction unit 808 is further configured to, for the unqualified finger structure, in response to any of the at least one source-drain terminal connection line being not provided with an upper connected via, form a new via on the source-drain terminal connection line; and extend the upper metal line to connect all newly formed vias, to obtain the qualified finger structure.

Figure 14:
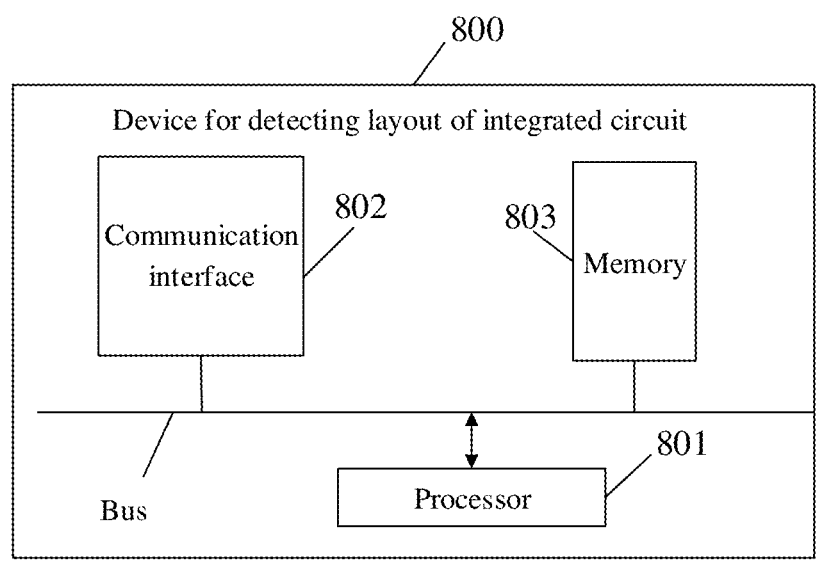
FIG. 14 is a second structural diagram of a device for detecting a layout of an integrated circuit according to an embodiment of the present disclosure.

It should be noted that FIG. 14 is an optional structural diagram of a device for detecting a layout of an integrated circuit according to an embodiment of the present disclosure. As shown in FIG. 14, hardware entities of the device 800 for detecting a layout of an integrated circuit include a processor 801, a communication interface 802 and a memory 803.

The processor 801 is typically configured to control an overall operation of the device 800 for detecting a layout of an integrated circuit.

The communication interface 802 is configured to enable the device 800 for detecting a layout of an integrated circuit to communicate with other apparatuses or devices through a network.

The memory 803 is configured to store instructions and applications executable by the processor 801, and may further be configured to cache data (e.g., picture data, audio data, voice communication data, and video communication data) to be processed or already processed by the processor 801 and the modules in the device 800 for detecting a layout of an integrated circuit. The memory 803 may be implemented by flash memory or random access memory (RAM).

It should be noted that, in the embodiment of the present disclosure, if the above method is implemented in the form of a software function module and sold or used as an independent product, the method may also be stored in a computer readable storage medium. Based on such an understanding, the technical solutions of the embodiments of the present disclosure essentially, or the part contributing to some implementations may be implemented in the form of a software product. The computer software product is stored in a storage medium and includes several instructions for instructing the device 800 for detecting a layout of an integrated circuit (which may be a personal computer, a server, a network device, or the like) to perform all or some of the methods described in the various embodiments of the present disclosure. The foregoing storage medium includes any medium that can store program code, such as a USB flash drive, a removable hard disk, a read only memory (ROM), a magnetic disk, or an optical disk. In this way, the embodiments of the present disclosure are not limited to any specific combination of hardware and software.

Correspondingly, an embodiment of the present disclosure provide a computer-readable storage medium having stored thereon a computer program that, when being executed by a processor, causes the processor to implement the steps in a method corresponding to the above device for detecting a layout of an integrated circuit.

It should be noted here that the description of the above storage medium and device embodiments is similar to the description of the above method embodiments and has similar advantages as the method embodiments. Technical details not disclosed in the storage medium and device embodiments of the present disclosure can be understood with reference to the description of the method embodiments of the present disclosure.

It should be noted that, herein, the terms "comprise", "include" or any other variation thereof are intended to encompass non-exclusive inclusion, such that a process, method, article or device comprising a series of elements includes not only those elements, but also includes other elements not expressly listed or inherent to such a process, method, article or device. Without further limitation, an element modified by the phrase "comprising a . . . " does not preclude the presence of additional identical elements in a process, method, article or device that includes the element.

In several embodiments provided by the present disclosure, it should be understood that the disclosed device and method may be implemented in other ways. The device embodiments described above are merely illustrative. For example, the division of the unit is only a logical function division. In actual implementation, there may be other division manners, such as multiple units or components can be combined, or can be integrated into another system, or some features can be ignored, or not implemented. In addition, the coupling, or direct coupling, or communication connection between the components shown or discussed may be indirect coupling or communication connection through interfaces, devices or units, and may be electrical, mechanical, or other forms.

The unit described above as a separate part may or may not be physically separate, and the part displayed as a unit may or may not be a physical unit, and may be located in a place or may be distributed over a plurality of network elements. Some or all of the units may be selected according to a practical requirement to achieve the purposes of the solutions in the embodiments.

In addition, each functional unit in each embodiment of the present disclosure may be integrated into one processing unit, each unit may also serve as an independent unit, and two or more than two units may also be integrated into one unit. The integrated unit may be implemented in the form of hardware and may also be implemented in the form of hardware and software functional unit.

Described above are merely specific embodiments of the present disclosure and the scope of protection of the present disclosure is not limited thereto. Any variations or replacements apparent to those skilled in the art within the technical scope disclosed in the present disclosure shall fall within the scope of protection of the present disclosure. Accordingly, the scope of protection of the present disclosure shall be subject to the scope of protection of the claims.

Embodiments of the present disclosure provide a method and device for detecting a layout of an integrated circuit, and a storage medium. A finger structure can be determined in the layout. Then, the number of at least one upper connected source-drain terminal and the number of at least one upper connected via in the finger structure are calculated respectively. Finally, for the finger structure, in response to the number of the at least one upper connected source-drain terminal being greater than the number of the at least one upper connected via, it is determined that the finger structure is an unqualified finger structure. In this way, the unqualified finger structure with insufficient upper connected vias in the layout may be detected, design defects may be found in time for correction, and the quality of the layout may be improved, thereby improving the yield of the chip.

What is claimed is:

1. A method for detecting a layout of an integrated circuit, comprising:
    determining a finger structure in the layout, wherein the finger structure comprises at least one upper connected source-drain terminal and at least one upper connected via, and the at least one upper connected source-drain terminal is electrically connected to an upper metal line through the at least one upper connected via;

calculating a number of the at least one upper connected source-drain terminal and a number of the at least one upper connected via; and for the finger structure, in response to the number of the at least one upper connected source-drain terminal being greater than the number of the at least one upper connected via, determining that the finger structure is an unqualified finger structure.

2. The method for detecting a layout of an integrated circuit of claim 1, wherein determining the finger structure in the layout comprises:

identifying a Metal-Oxide-Semiconductor (MOS) structure in the layout; and determining the finger structure in the MOS structure.

3. The method for detecting a layout of an integrated circuit of claim 2, wherein identifying the MOS structure in the layout comprises:

determining a target layer pattern in the layout based on preset identification layer information; and identifying the MOS structure in the target layer pattern through a Boolean operation.

4. The method for detecting a layout of an integrated circuit of claim 3, wherein identifying the MOS structure in the target layer pattern through the Boolean operation comprises:

identifying at least one active region in the target layer pattern;

determining a target active region in the at least one active region, wherein the target active region intersects at least one gate structure; and removing a guard ring and a diode structure in the target active region to obtain the MOS structure.

5. The method for detecting a layout of an integrated circuit of claim 4, wherein the MOS structure comprises a positive channel Metal-Oxide-Semiconductor (PMOS) structure and a negative channel Metal-Oxide-Semiconductor (NMOS) structure; and in response to the layout characterizing a P-type substrate, the PMOS structure is surrounded by a P-type implantation region and an N-well region, and the NMOS structure is surrounded by an N-type implantation region.

6. The method for detecting a layout of an integrated circuit of claim 2, wherein determining the finger structure in the MOS structure comprises:

calculating a number of side-by-side gate structures in the MOS structure, wherein the side-by-side gate structures are arranged in parallel in the layout; and in response to the number of side-by-side gate structures in the MOS structure being greater than or equal to 2, determining that the MOS structure is the finger structure.

7. The method for detecting a layout of an integrated circuit of claim 1, wherein calculating the number of the at least one upper connected source-drain terminal and the number of the at least one upper connected via comprises:

determining an upper connected finger metal line in the finger structure based on a connection characteristic, wherein the connection characteristic comprises that: the upper connected finger metal line is electrically connected to the at least one upper connected source-drain terminal, and the at least one upper connected via is located on the upper connected finger metal line; and calculating the number of the at least one upper connected via and the number of the at least one upper connected source-drain terminal through a Boolean operation based on the upper connected finger metal line.

8. The method for detecting a layout of an integrated circuit of claim 1, wherein for the finger structure, after determining that the finger structure is the unqualified finger structure in response to the number of the at least one upper connected source-drain terminal being greater than the number of the at least one upper connected via, the method further comprises:

displaying the unqualified finger structure on the layout.

9. The method for detecting a layout of an integrated circuit of claim 7, wherein for the finger structure, after determining that the finger structure is the unqualified finger structure in response to the number of the at least one upper connected source-drain terminal being greater than the number of the at least one upper connected via, the method further comprises:

correcting the unqualified finger structure to a qualified finger structure.

10. The method for detecting a layout of an integrated circuit of claim 9, wherein the upper connected finger metal line comprises at least one source-drain terminal connection line, wherein each of the at least one source-drain terminal connection line is electrically connected to a respective one of the at least one upper connected source-drain terminal; and correcting the unqualified finger structure to the qualified finger structure comprises:

for the unqualified finger structure, in response to any of the at least one source-drain terminal connection line being not provided with an upper connected via, forming a new via on the source-drain terminal connection line; and extending the upper metal line to connect all newly formed vias to obtain the qualified finger structure.

11. A device for detecting a layout of an integrated circuit, comprising:

a processor;

a memory for storing program instructions executable by the processor; and a communication interface, wherein the processor is configured to run the program instructions to:

determine a finger structure in the layout, wherein the finger structure comprises at least one upper connected source-drain terminal and at least one upper connected via, and the at least one upper connected source-drain terminal is electrically connected to an upper metal line through the at least one upper connected via;

calculate a number of the at least one upper connected source-drain terminal and a number of the at least one upper connected via; and for the finger structure, in response to the number of the at least one upper connected source-drain terminal being greater than the number of the at least one upper connected via, determine that the finger structure is an unqualified finger structure.

12. The device for detecting a layout of an integrated circuit of claim 11, wherein the processor is further configured to:

identify a Metal-Oxide-Semiconductor (MOS) structure in the layout; and determine the finger structure in the MOS structure.

13. The device for detecting a layout of an integrated circuit of claim 12, wherein the processor is further configured to:
   determine a target layer pattern in the layout based on preset identification layer information; and
   identify the MOS structure in the target layer pattern through a Boolean operation.

14. The device for detecting a layout of an integrated circuit of claim 13, wherein the processor is further configured to:
   identify at least one active region in the target layer pattern;
   determine a target active region in the at least one active region, wherein the target active region intersects at least one gate structure; and
   remove a guard ring and a diode structure in the target active region to obtain the MOS structure.

15. The device for detecting a layout of an integrated circuit of claim 12, wherein the processor is further configured to:
   calculate a number of side-by-side gate structures in the MOS structure, wherein the side-by-side gate structures are arranged in parallel in the layout; and
   in response to the number of side-by-side gate structures in the MOS structure being greater than or equal to 2, determine that the MOS structure is the finger structure.

16. The device for detecting a layout of an integrated circuit of claim 11, wherein the processor is further configured to:
   determine an upper connected finger metal line in the finger structure based on a connection characteristic, wherein the connection characteristic comprises that: the upper connected finger metal line is electrically connected to the at least one upper connected source-drain terminal, and the at least one upper connected via is located on the upper connected finger metal line; and
   calculate the number of the at least one upper connected via and the number of the at least one upper connected source-drain terminal through a Boolean operation based on the upper connected finger metal line.

17. The device for detecting a layout of an integrated circuit of claim 11, further comprising:
   a display, configured to display the unqualified finger structure on the layout.

18. The device for detecting a layout of an integrated circuit of claim 16, wherein the processor is further configured to:
   correct the unqualified finger structure to a qualified finger structure.

19. The device for detecting a layout of an integrated circuit of claim 18, wherein the upper connected finger metal line comprises at least one source-drain terminal connection line, wherein each of the at least one source-drain terminal connection line is electrically connected to a respective one of the at least one upper connected source-drain terminal; and
   the processor is further configured to:
   for the unqualified finger structure, in response to any of the at least one source-drain terminal connection line being not provided with an upper connected via, form a new via on the source-drain terminal connection line; and
   extend the upper metal line to connect all newly formed vias to obtain the qualified finger structure.

20. A non-transitory computer-readable storage medium having stored thereon executable instructions that, when being executed by a processor, cause the processor to implement operations comprising:
   determining a finger structure in a layout, wherein the finger structure comprises at least one upper connected source-drain terminal and at least one upper connected via, and the at least one upper connected source-drain terminal is electrically connected to an upper metal line through the at least one upper connected via;
   calculating a number of the at least one upper connected source-drain terminal and a number of the at least one upper connected via; and
   for the finger structure, in response to the number of the at least one upper connected source-drain terminal being greater than the number of the at least one upper connected via, determining that the finger structure is an unqualified finger structure.

* * * * *